(12) United States Patent
Ando et al.

(10) Patent No.: US 12,327,982 B2
(45) Date of Patent: Jun. 10, 2025

(54) LASER DIODE DRIVE CIRCUIT

(71) Applicant: Murata Manufacturing Co., Ltd., Nagaokakyo (JP)

(72) Inventors: Shota Ando, Nagaokakyo (JP); Naomi Takimoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 601 days.

(21) Appl. No.: 17/706,807

(22) Filed: Mar. 29, 2022

(65) Prior Publication Data

US 2022/0224076 A1  Jul. 14, 2022

Related U.S. Application Data

(63) Continuation of application No. PCT/JP2020/023941, filed on Jun. 18, 2020.

(30) Foreign Application Priority Data

Sep. 30, 2019  (JP) ................................. 2019-180505

(51) Int. Cl.
*H01S 3/00* (2006.01)
*H01S 5/00* (2006.01)
(Continued)

(52) U.S. Cl.
CPC .......... *H01S 5/0428* (2013.01); *H01S 5/0057* (2013.01); *H01S 5/06835* (2013.01);
(Continued)

(58) Field of Classification Search
CPC .. H01S 5/0428; H01S 5/0057; H01S 5/06835; H01S 5/4025; H01S 5/042
See application file for complete search history.

(56) References Cited

U.S. PATENT DOCUMENTS 4,620,521 A * 11/1986 Henderson .............. F02P 1/086
                                                          310/70 A
9,368,936 B1     6/2016 Lenius et al.
(Continued)

FOREIGN PATENT DOCUMENTS

CN        204885822 U    12/2015
JP        S6234454 U      2/1987
(Continued)

OTHER PUBLICATIONS

International Search Report issued for PCT/JP2020/023941, date of mailing Sep. 15, 2020.

*Primary Examiner* — Kinam Park
(74) *Attorney, Agent, or Firm* — ArentFox Schiff LLP

(57) ABSTRACT

A laser diode drive circuit is provided that includes a plurality of laser diodes having cathode sides connected in common, a capacitor that supplies a current to the laser diodes, and a switching element. The laser diode drive circuit further includes a driving power supply that supplies a current to the capacitor, a diode that restricts a flow of the current in a direction of charging of the capacitor, and current suppression elements provided on anode sides of the plurality of laser diodes, respectively, the current suppression elements suppressing a flow of the current that flows to one laser diode to another laser diode in discharging of the capacitor.

20 Claims, 9 Drawing Sheets

(51) Int. Cl.
*H01S 5/042* (2006.01)
*H01S 5/0683* (2006.01)
*H01S 5/40* (2006.01)
*G01S 7/484* (2006.01)

(52) U.S. Cl.
CPC ............ *H01S 5/4025* (2013.01); *G01S 7/484* (2013.01); *H01S 5/042* (2013.01)

(56) References Cited

U.S. PATENT DOCUMENTS

| | | | |
|---|---|---|---|
| 2003/0016711 A1* | 1/2003 | Crawford | H01S 5/042 372/38.02 |
| 2009/0161710 A1 | 6/2009 | Hoashi et al. | |
| 2017/0085057 A1* | 3/2017 | Barnes | H01S 5/06808 |
| 2019/0227170 A1 | 7/2019 | Niimura | |
| 2019/0229493 A1* | 7/2019 | Stern | H01S 5/0428 |
| 2020/0178361 A1 | 6/2020 | Oka | |
| 2021/0313763 A1* | 10/2021 | Fujiwara | H01S 5/4025 |

FOREIGN PATENT DOCUMENTS

| | | |
|---|---|---|
| JP | 2009170870 A | 7/2009 |
| JP | 2016127214 A | 7/2016 |
| JP | 2016152336 A | 8/2016 |
| WO | 2018066612 A1 | 4/2018 |

* cited by examiner

LASER DIODE DRIVE CIRCUIT

CROSS REFERENCE TO RELATED APPLICATIONS

The present application is a continuation of PCT/JP2020/023941 filed Jun. 18, 2020, which claims priority to Japanese Patent Application No. 2019-180505, filed Sep. 30, 2019, the entire contents of each of which are incorporated herein by reference.

TECHNICAL FIELD

The present disclosure relates to a laser diode drive circuit.

BACKGROUND

Light detection and ranging (LiDAR) HAS recently been used for an automobile system or a weather observation system. The LiDAR refers to a system that analyzes a distance to a remote object or a property of the object by irradiating the object with light (e.g., a pulse of light) from a laser diode that emits pulsed light and measuring light scattered by the object.

Various laser diode drive circuits that can be used for the LiDAR have been developed as described in Japanese Patent Laying-Open No. 2016-152336 (hereinafter "PTL 1") and Japanese Patent Laying-Open No. 2009-170870 (hereinafter "PTL 2"). PTL 1 discloses a laser diode drive circuit including a series circuit in which a direct-current (DC) power supply, an inductor, a current backflow prevention element, a capacitor, and a laser diode are connected in series, the laser diode emitting light by using an emission current from the capacitor, a switching element, and a control circuit. The switching element in PTL 1 has one end connected between the current backflow prevention element and the capacitor, and switches a current that flows to the inductor based on ON and OFF states controlled by the control circuit.

PTL 2 discloses a configuration in which a switching element for charging has a drain electrode connected to an anode side of each laser diode and has a source electrode connected a power supply. In PTL 2, a switching element for driving has a drain electrode connected to a cathode side of each laser diode, and a capacitor is connected between the anode of each laser diode and a GND line.

In the configuration described in PTL 1, however, in driving a plurality of laser diodes, irradiation with short pulses of light by sequential light emission from the plurality of laser diodes cannot be carried out, and a circuit configuration for individually controlling the plurality of laser diodes cannot be adopted.

In addition, in the configuration described in PTL 2, when switching between on and off states of the switching element is made in order to drive one laser diode, a current flows also to another laser diode through a parasitic capacitance that exists between the drain electrode and the source electrode of the switching element. Therefore, in the configuration in PTL 2, a laser diode may emit light at timing when light emission is not desired, or a laser diode not desired to emit light may emit light.

SUMMARY OF THE INVENTION

Accordingly, it is an object of the present disclosure to provide a laser diode drive circuit configured for individually controlling a laser diode desired to emit light to emit light at a timing when light emission therefrom is desired.

In an exemplary aspect, a laser diode drive circuit is provided that includes a plurality of laser diodes having cathode sides connected in common, a driving capacitor connected in series to the laser diodes, with the driving capacitor supplying a current to the laser diodes, a driving switching element connected in series to the driving capacitor, with the driving switching element switching between an ON state in which a current is supplied to the laser diodes and an OFF state in which the current is not supplied, a driving power supply that supplies a current to the driving capacitor, a restriction element connected in parallel to the laser diodes and in series to the driving power supply and the driving capacitor, with the restriction element restricting a flow of the current in a direction of charging of the driving capacitor, and current suppression elements provided on anode sides of the plurality of laser diodes, respectively, with the current suppression elements suppressing a flow of a current that flows to one laser diode to another laser diode in discharging of the driving capacitor.

According to the exemplary aspects of the present disclosure, when a plurality of laser diodes having cathode sides connected in common are individually controlled to emit light, light emission can be prevented from a laser diode at a timing when light emission therefrom is not desired.

DETAILED DESCRIPTION OF EMBODIMENTS

Figure 1:
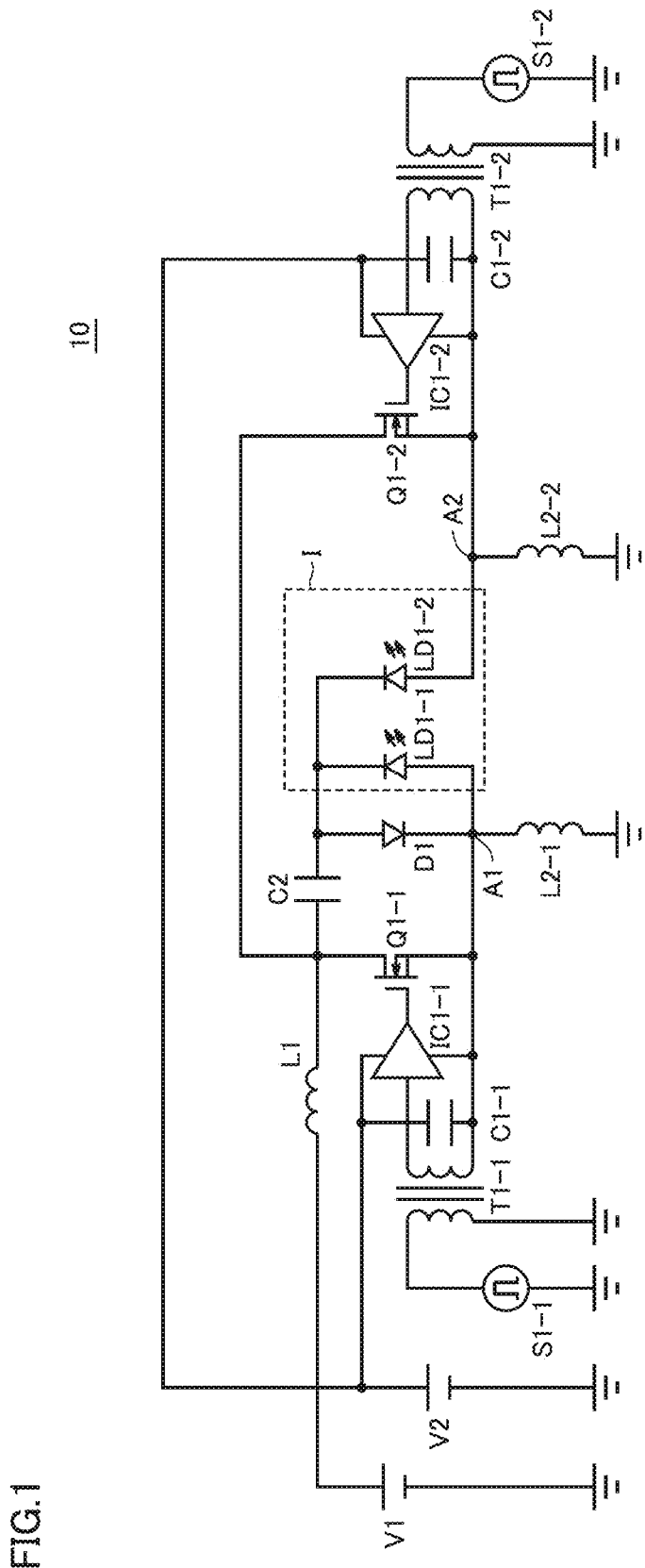
FIG. 1 is a circuit diagram showing a laser diode drive circuit according to a first exemplary embodiment.

Each exemplary embodiment will be described in detail below with reference to the drawings. The same or corresponding elements in the drawings have the same reference characters allotted and description thereof will not be repeated.

First Exemplary Embodiment

FIG. 1 is a circuit diagram showing a laser diode drive circuit 10 according to a first exemplary embodiment. A circuit configuration of laser diode drive circuit 10 according to the first embodiment and operations thereof will be described with reference to FIG. 1.

In general, laser diode drive circuit 10 is adopted in a system that provides short pulses of light, such as light detection and ranging (LiDAR), and drives a plurality of laser diodes LD1-1 and LD1-2. Specifically, laser diode drive circuit 10 is a drive circuit that drives a laser diode array I in which the plurality of laser diodes LD1-1 and LD1-2 having cathodes connected in common are formed on a single substrate. Though the laser diode drive circuit that drives laser diode array I including two laser diodes is described in the exemplary embodiment below, without being limited thereto, the laser diode drive circuit may be configured to drive laser diode array I including three or more laser diodes in alternative aspects.

As shown, laser diode drive circuit 10 includes laser diodes LD1-1 and LD1-2, laser diode driving switching elements Q1-1 and Q1-2 (which are also referred to as switching elements Q1-1 and Q1-2 below), drive circuits IC1-1 and IC1-2, drive circuit capacitors C1-1 and C1-2 (which are also referred to as capacitors C1-1 and C1-2 below), transformers T1-1 and T1-2, signal sources S1-1 and S1-2, and a drive circuit driving power supply V2 (which is also referred to as a driving power supply V2). Laser diode drive circuit 10 further includes a laser diode driving power supply V1 (which is also referred to as a driving power supply V1 below), an inductor L1, a laser diode driving capacitor C2 (which is also referred to as a capacitor C2 below), and a diode D1 connected in parallel to laser diode LD1-1. It is noted that an element connected in parallel to laser diode LD1-1 is not limited to diode D1. A resistive element sufficiently high in resistance against impedances in a forward direction of laser diodes LD1-1 and LD1-2 and sufficiently low in resistance against impedances in a reverse direction can be implemented, and the element should only be a restriction element that restricts a flow of a current in a direction of charging of capacitor C2.

In the first exemplary embodiment, inductors L2-1 and L2-2 are provided in laser diode drive circuit 10 and configured as current suppression elements that suppress a flow of a current that flows from one laser diode to another laser diode in discharging of capacitor C2. In this aspect, inductors L2-1 and L2-2 are provided on respective anode sides of laser diodes LD1-1 and LD1-2.

Moreover, light emission from laser diodes LD1-1 and LD1-2 is controlled by switching elements Q1-1 and Q1-2. In particular, laser diodes LD1-1 and LD1-2 have the anodes connected to source electrodes of switching elements Q1-1 and Q1-2, respectively and also have cathodes connected in common.

Driving power supply V1 is a DC power supply that supplies charges to be used for light emission from laser diodes LD1-1 and LD1-2 to laser diodes LD1-1 and LD1-2 by charging capacitor C2. In addition, capacitor C2 is connected between the cathode of laser diode LD1-1 and a drain electrode of switching element Q1-1.

In the exemplary aspect, switching elements Q1-1 and Q1-2 are N-type switching elements, such as a MOSFET or a GaN FET, and are connected in parallel to respective laser diodes LD1-1 and LD1-2. In operation, switching elements Q1-1 and Q1-2 switch between a state (an ON state) in which a current stored in capacitor C2 flows to laser diodes LD1-1 and LD1-2 and a state (an OFF state) in which the current does not flow to laser diodes LD1-1 and LD1-2. Although switching elements Q1-1 and Q1-2 can be P-type switching elements in an alternative aspect, by adopting the N-type switching elements, a high current to be fed to laser diodes LD1-1 and LD1-2 can be switched fast.

Moreover, switching elements Q1-1 and Q1-2 can be switched between the ON state and the OFF state fast, so that laser diodes LD1-1 and LD1-2 can emit short pulses of light in operation.

In operation, drive circuits IC1-1 and IC1-2 have switching elements Q1-1 and Q1-2 that are configured to switch between the ON state and the OFF state based on signals from signal sources S1-1 and S1-2, respectively. Moreover, signals from signal sources S1-1 and S1-2 are boosted by transformers T1-1 and T1-2 and supplied to drive circuits IC1-1 and IC1-2, respectively.

Operations of laser diode drive circuit 10 will now be described. Initially, when output signals from signal sources S1-1 and S1-2 are at a Low level, output voltages from transformers T1-1 and T1-2 connected to respective signal sources S1-1 and S1-2 are also at the Low level. When output voltages from transformers T1-1 and T1-2 are at the Low level, input voltages to drive circuits IC1-1 and IC1-2 connected to respective transformers T1-1 and T1-2 are also at the Low level.

At this time, capacitor C2 is charged with a current that flows through a path in which driving power supply V1, inductor L1, capacitor C2, diode D1, and inductor L2-1 are connected in series. Capacitors C1-1 and C1-2 are charged with a current that flows through a path in which driving power supply V2, capacitors C1-1 and C1-2, and inductors L2-1 and L2-2 are connected in series.

When output signals from signal sources S1-1 and S1-2 are at a High level, output voltages from transformers T1-1 and T1-2 connected to respective signal sources S1-1 and S1-2 are also at the High level. When output voltages from transformers T1-1 and T1-2 are at the High level, input voltages to drive circuits IC1-1 and IC1-2 connected to respective transformers T1-1 and T1-2 are also at the High level.

At this time, the current flows through a path in which capacitors C1-1 and C1-2, drive circuits IC1-1 and IC1-2, and gate electrodes and source electrodes of switching elements Q1-1 and Q1-2 are connected in series, so that switching elements Q1-1 and Q1-2 are set to the ON state. When switching elements Q1-1 and Q1-2 are set to the ON state, a discharging current from capacitor C2 flows through a path in which capacitor C2, drain electrodes and the source electrodes of switching elements Q1-1 and Q1-2, and laser diodes LD1-1 and LD1-2 are connected in series, so that laser diodes LD1-1 and LD1-2 emit light.

In controlling laser diodes LD1-1 and LD1-2 to emit short pulses of light, switching between the ON state and the OFF state of switching elements Q1-1 and Q1-2 is made fast. As switching elements Q1-1 and Q1-2 switch fast, a voltage and a current at a high frequency are applied to laser diodes LD1-1 and LD1-2.

In this configuration, a high impedance exists between the anode sides of laser diodes LD1-1 and LD1-2 and GND owing to inductors L2-1 and L2-2 that function to cut off a voltage and a current at a high frequency. Therefore, the voltage and the current at the high frequency applied to laser diodes LD1-1 and LD1-2 do not flow to GND through inductors L2-1 and L2-2. Thus, even when laser diodes LD1-1 and LD1-2 have the cathodes connected in common, individual laser diodes LD1-1 and LD1-2 can be controlled to emit light at different timings.

Specifically, when a current at a high frequency flows to laser diode LD1-1 at the time of light emission from laser diode LD1-1, a current does not flow to laser diode LD1-2 having the cathode connected in common due to an electrical function of inductor L2-1. Similarly, when a current at a high frequency flows to laser diode LD1-2 at the time of light emission from laser diode LD1-2, a current does not flow to laser diode LD1-1 having the cathode connected in common due to an electrical function of inductor L2-2.

Therefore, laser diode drive circuit 10 can control a plurality of laser diodes to emit light at different timings by shifting timing of signals from respective signal sources S1-1 and S1-2.

Functions of inductors L2-1 and L2-2 that cut off a voltage and a current at a high frequency will now be described in detail. In order for inductors L2-1 and L2-2 to cut off a current that flows to respective laser diodes LD1-1 and LD1-2, impedance values of inductors L2-1 and L2-2 should be larger than absolute values of impedances of respective laser diodes LD1-1 and LD1-2.

Specifically, L represents inductances of inductors L2-1 and L2-2, fld represents a pulse frequency of pulses of light emitted from laser diodes LD1-1 and LD1-2, fsw represents an emission frequency of emission of pulses of light from laser diodes LD1-1 and LD1-2, and Zld represents impedances of laser diodes LD1-1 and LD1-2. Pulse frequency fld is defined, with pulses of light emitted from laser diodes LD1-1 and LD1-2 being defined as having a ½ cycle of a sin wave. Emission frequency fsw is defined, with an interval of pulses of light emitted from laser diodes LD1-1 and LD1-2 being defined as one cycle. Impedance Zld is defined as an impedance from points of connection A1 and A2 shown in FIG. 1 to a terminal of capacitor C2 connected to the cathodes of laser diodes LD1-1 and LD1-2. Naturally, so long as the impedances of laser diodes LD1-1 and LD1-2 themselves are higher than impedances of the other components, the impedances of laser diodes LD1-1 and LD1-2 themselves may be defined as impedance Zld.

According to an exemplary aspect, inductances L of inductors L2-1 and L2-2 and impedances Zld of laser diodes LD1-1 and LD1-2 satisfy relation in an expression 1 below.

$$|Zld| < 2\pi fld \times L \qquad \text{(Expression 1)}$$

Pulse frequency fld is preferably within a range not lower than 100 MHz and not higher than 1 GHz. Inductances L of inductors L2-1 and L2-2 are set to a value within a range where charging by an amount of charges released from capacitor C2 can be completed within a time period corresponding to one cycle of emission frequency fsw (a reciprocal of the cycle of emission of pulses of light).

Figure 2:
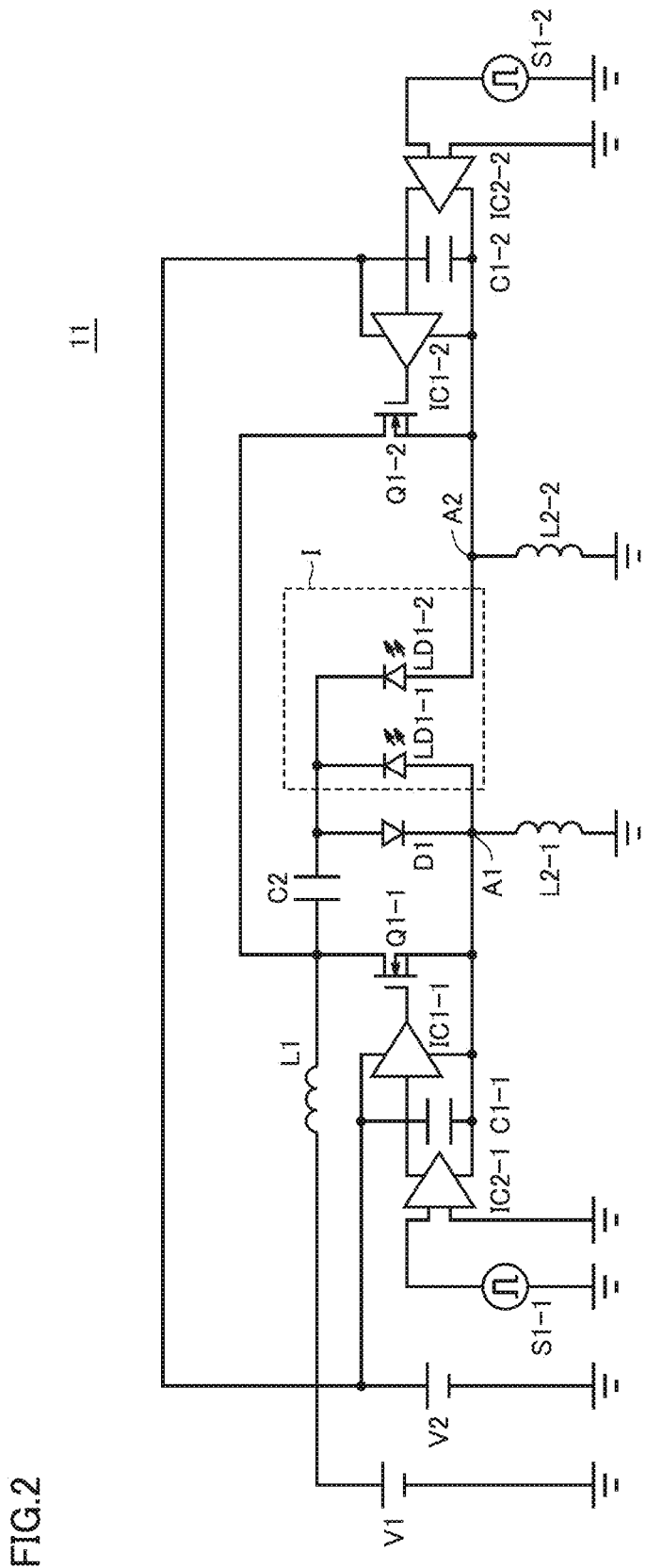
FIG. 2 is a circuit diagram showing a laser diode drive circuit according to a first modification of the first exemplary embodiment.

Now, a modification of the laser diode drive circuit according to the present first exemplary embodiment will be described. FIG. 2 is a circuit diagram showing a laser diode drive circuit 11 according to a first modification of the first embodiment. In laser diode drive circuit 11 shown in FIG. 2, high-side driver circuits IC2-1 and 2-2 instead of transformers T1-1 and T1-2 shown in FIG. 1 are connected to drive circuits IC1-1 and IC1-2. Components in laser diode drive circuit 11 shown in FIG. 2 the same as those in laser diode drive circuit 10 shown in FIG. 1 have the same reference characters allotted and detailed description will not be repeated.

High-side driver circuits IC2-1 and 2-2 are, for example, isolation ICs, and can be configured to provide signals from signal sources S1-1 and S1-2 to drive circuits IC1-1 and IC1-2, respectively, while they isolate signal source S1-1 and drive circuit IC1-1 from each other and isolate signal source S1-2 and drive circuit IC1-2 from each other. By including high-side driver circuits IC2-1 and 2-2 in laser diode drive circuit 11, laser diode drive circuit 11 can be smaller in size than laser diode drive circuit 10 including transformers T1-1 and T1-2. Laser diode drive circuit 11 can otherwise achieve an effect comparable to the effect of laser diode drive circuit 10.

Figure 3:
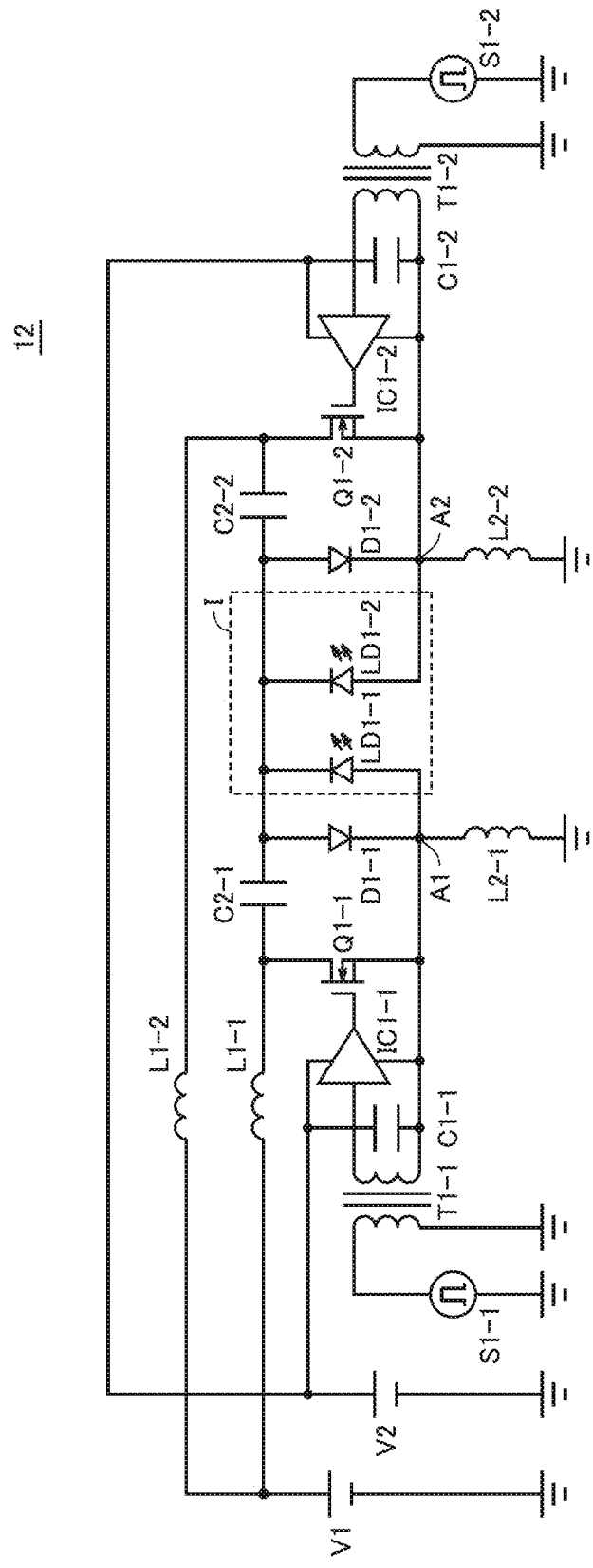
FIG. 3 is a circuit diagram showing a laser diode drive circuit according to a second modification of the first exemplary embodiment.

FIG. 3 is a circuit diagram showing a laser diode drive circuit 12 according to a second modification of the first exemplary embodiment. Laser diode drive circuit 12 shown in FIG. 3 includes capacitors C2-1 and C2-2 instead of capacitor C2 shown in FIG. 1. Components in laser diode drive circuit 12 shown in FIG. 3 the same as those in laser diode drive circuit 10 shown in FIG. 1 have the same reference characters allotted and detailed description will not be repeated.

In laser diode drive circuit 10 shown in FIG. 1, a capacitor that supplies a current to laser diodes LD1-1 and LD1-2 is capacitor C2, which is a common capacitor. In laser diode drive circuit 12 shown in FIG. 3, the capacitor is provided as being split into a plurality of capacitors, i.e., capacitor C2-1 that supplies a current to laser diode LD1-1 and capacitor C2-2 that supplies a current to laser diode LD1-2. In laser diode drive circuit 12, an inductor L1-1 and a diode D1-1 are connected to capacitor C2-1, and an inductor L1-2 and a diode D1-2 are connected to capacitor C2-2.

Thus, laser diode drive circuit 12 includes a driving capacitor that supplies a current for each laser diode. Therefore, a capacitor in common that is high in capacity does not have to be provided in laser diode drive circuit 12. By providing a plurality of capacitors low in capacity, a size can be reduced and manufacturing cost can be reduced. Since capacitors C2-1 and C2-2 can individually be charged and can individually discharge in laser diode drive circuit 12, capacitor C2-2 for driving laser diode LD1-2 can be charged also while laser diode LD1-1 is driven. Therefore, in laser diode drive circuit 12, emission frequency fsw of pulses of light emitted from laser diodes LD1-1 and LD1-2 can be high. Furthermore, in laser diode drive circuit 12, possibility of light emission from a laser diode other than a laser diode to be driven due to a parasitic capacitance, a parasitic inductance, or a parasitic resistance of the switching element, the laser diode, or a line between components can be lowered. Laser diode drive circuit 12 can otherwise achieve an effect comparable to the effect of laser diode drive circuit 10.

Figure 4:
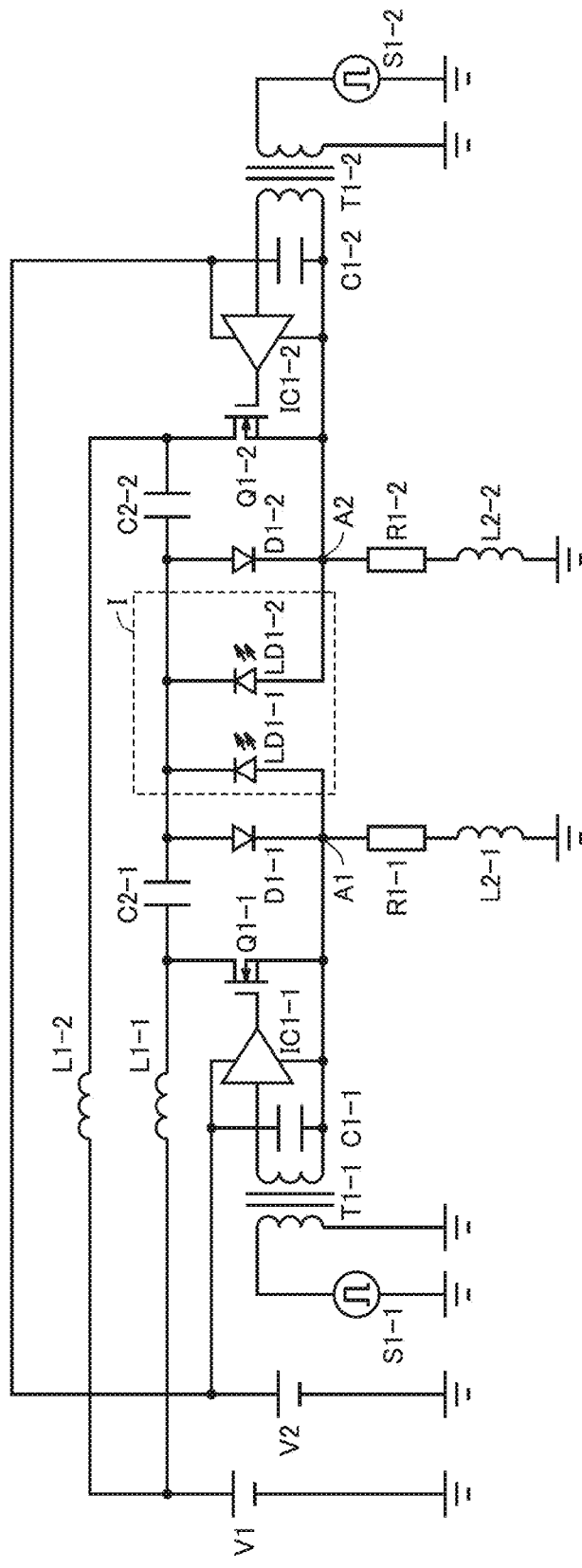
FIG. 4 is a circuit diagram showing a laser diode drive circuit according to a third modification of the first exemplary embodiment.

FIG. 4 is a circuit diagram showing a laser diode drive circuit 13 according to a third modification of the first exemplary embodiment. Laser diode drive circuit 13 shown in FIG. 4 is different in configuration from laser diode drive circuit 12 shown in FIG. 3 in additionally including resistive elements R1-1 and R1-2. Components in laser diode drive circuit 13 shown in FIG. 4 the same as those in laser diode drive circuit 10 shown in FIG. 1 and laser diode drive circuit 12 shown in FIG. 3 have the same reference characters allotted and detailed description will not be repeated.

In laser diode drive circuit 13 shown in FIG. 4, resistive element R1-1 is connected in series to inductor L2-1 and resistive element R1-2 is connected in series to inductor L2-2. Thus, in laser diode drive circuit 13, ringing (e.g., noise) produced by functions of capacitors C2-1 and C2-2 and inductors L2-1 and L2-2 due to passage of a charging current through inductors L2-1 and L2-2 in charging of capacitors C2-1 and C2-2 can be suppressed by resistive elements R1-1 and R1-2.

When resistive elements R1-1 and R1-2 are provided as in laser diode drive circuit 13, in order for inductors L2-1 and L2-2 to cut off a current that flows to laser diodes LD1-1 and LD1-2, impedance values of inductors L2-1 and L2-2 including resistive elements R1-1 and R1-2 should be larger than the absolute values of the impedances of laser diodes LD1-1 and LD1-2.

Specifically, L represents inductances of inductors L2-1 and L2-2, fld represents a pulse frequency of pulses of light emitted from laser diodes LD1-1 and LD1-2, fsw represents an emission frequency of emission of pulses of light from laser diodes LD1-1 and LD1-2, Zld represents impedances of laser diodes LD1-1 and LD1-2, and R represents resistance values of resistive elements R1-1 and R1-2.

Inductances of inductors L2-1 and L2-2 including resistive elements R1-1 and R1-2 and impedances Zld of laser diodes LD1-1 and LD1-2 satisfy relation in an expression 2 below.

$$|Zld| < 2\pi fld \times L + R \quad \text{(Expression 2)}$$

Pulse frequency fld is preferably within a range not lower than 100 MHz and not higher than 1 GHz.

Resistive elements R1-1 and R1-2 shown in FIG. 4 are provided between the anode sides of laser diodes LD1-1 and LD1-2 and inductors L2-1 and L2-2, respectively.

Without being limited to this configuration, resistive elements R1-1 and R1-2 can be provided at any position so long as they are provided between points of connection A1 and A2 and GND, and they can be provided as being divided in a plurality of elements. Features described in the present first embodiment and the first to third modifications may be combined with one another.

As set forth above, laser diode drive circuit 10 according to the present first exemplary embodiment includes a plurality of laser diodes LD1-1 and LD1-2 having the cathode sides connected in common, capacitor C2 connected in series to laser diodes LD1-1 and LD1-2, capacitor C2 supplying a current to laser diodes LD1-1 and LD1-2, and switching elements Q1-1 and Q1-2 connected in series to capacitor C2, switching elements Q1-1 and Q1-2 switching between the ON state in which the current is supplied to laser diodes LD1-1 and LD1-2 and the OFF state in which the current is not supplied. Laser diode drive circuit 10 further includes driving power supply V1 that supplies the current to capacitor C2, diode D1 connected in parallel to laser diodes LD1-1 and LD1-2 and in series to driving power supply V1 and capacitor C2, diode D1 restricting a flow of the current in a direction of charging of capacitor C2, and current suppression elements provided on the anode sides of the plurality of laser diodes LD1-1 and LD1-2, respectively, the current suppression elements suppressing a flow of a current that flows to one laser diode to another laser diode in discharging of capacitor C2. Thus, in laser diode drive circuit 10, in individually controlling the plurality of laser diodes LD1-1 and LD1-2 having the cathode sides connected in common to emit light, light emission from laser diode LD1-1 or LD1-2 at an undesired timing can be prevented.

Moreover, the current suppression elements are preferably inductors L2-1 and L2-2. Absolute values of impedances of laser diodes LD1-1 and LD1-2 are smaller than impedance values of inductors L2-1 and L2-2 at a pulse frequency of laser diodes LD1-1 and LD1-2. The pulse frequency of laser diodes LD1-1 and LD1-2 is preferably within a range not lower than 100 MHz and not higher than 1 GHz.

Resistive elements R1-1 and R1-2 connected in series to respective inductors L2-1 and L2-2, respectively, are preferably further provided as shown in FIG. 4. Thus, in laser diode drive circuit 13, ringing (e.g., noise) produced in charging of capacitors C2-1 and C2-2 can be suppressed by resistive elements R1-1 and R1-2.

Absolute values of impedances of laser diodes LD1-1 and LD1-2 are smaller than a sum of impedances of inductors L2-1 and L2-2 at a pulse frequency of laser diodes LD1-1 and LD1-2 and impedances of resistive elements R1-1 and R1-2. The pulse frequency of laser diodes LD1-1 and LD1-2 is preferably within a range not lower than 100 MHz and not higher than 1 GHz.

Capacitor C2 is preferably a capacitor provided in common with the capacitor supplying a current to each of the plurality of laser diodes LD1-1 and LD1-2. Laser diode drive circuit 10 can thus be reduced in number of components included in the circuit.

Moreover, capacitors C2-1 and C2-2 are preferably individually provided capacitors that supply currents to the plurality of laser diodes LD1-1 and LD1-2, respectively.

Laser diode drive circuit 12 can thus be high in emission frequency fsw of pulses of light emitted from laser diodes LD1-1 and LD1-2.

Second Exemplary Embodiment

A laser diode drive circuit in a second exemplary embodiment will be described. In the first embodiment discussed above, an inductor is provided in order to suppress a flow of a current that flows to one laser diode to another laser diode in discharging of the driving capacitor. In contrast, in the second embodiment, the flow of the current in discharging of the driving capacitor is controlled by using a diode. Components similar to those in the first embodiment have the same reference characters allotted and description thereof will not be repeated.

Figure 5:
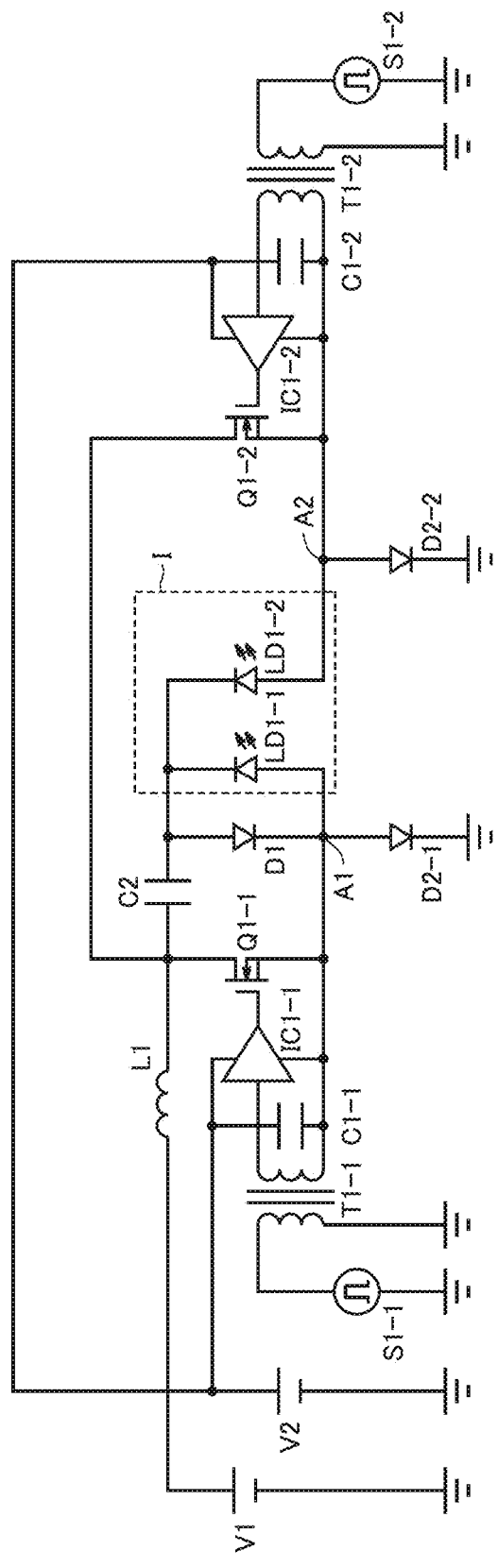
FIG. 5 is a circuit diagram showing a laser diode drive circuit according to a second exemplary embodiment.

FIG. 5 is a circuit diagram showing a laser diode drive circuit 20 according to the second exemplary embodiment. Referring to FIG. 5, diodes D2-1 and D2-2 instead of inductors L2-1 and L2-2 shown in the first embodiment are connected to laser diode drive circuit 20. Diodes D2-1 and D2-2 are exemplary current suppression elements. In charging of capacitor C2, a current flows through a path in which driving power supply V1, inductor L1, capacitor C2, diode D1, and diode D2-1 are connected in series.

In discharging of capacitor C2, a discharging current from capacitor C2 flows through a path in which capacitor C2, the drain electrodes and the source electrodes of switching elements Q1-1 and Q1-2, and laser diode LD1-1 are connected in series, whereas the current does not flow to laser diode LD1-2 through diodes D2-1 and D2-2.

Furthermore, in discharging of capacitor C2, the discharging current from capacitor C2 flows through a path in which capacitor C2, drain electrodes and source electrodes of switching elements Q1-1 and Q1-2, and laser diode LD1-2 are connected in series, whereas the current does not flow to laser diode LD1-1 through diodes D2-1 and D2-2.

Therefore, due to this configuration, laser diode drive circuit 20 can control the plurality of laser diodes to emit light at different timings by shifting timings of signals from respective signal sources S1-1 and S1-2.

Figure 6:
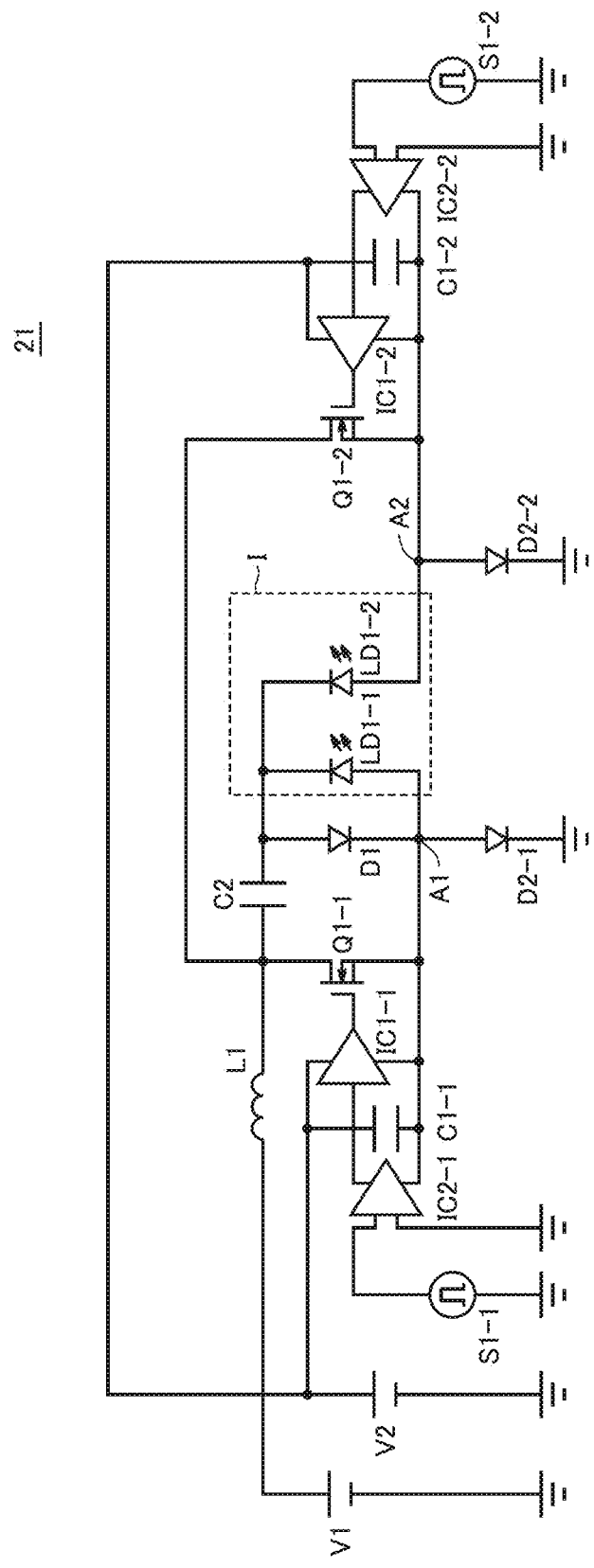
FIG. 6 is a circuit diagram showing a laser diode drive circuit according to a first modification of the second exemplary embodiment.

A modification of the laser diode drive circuit according to the present second exemplary embodiment will now be described. FIG. 6 is a circuit diagram showing a laser diode drive circuit 21 according to a first modification of the second embodiment. In laser diode drive circuit 21 shown in FIG. 6, high-side driver circuits IC2-1 and 2-2 instead of transformers T1-1 and T1-2 shown in FIG. 5 are connected to respective drive circuits IC1-1 and IC1-2. Components in laser diode drive circuit 21 shown in FIG. 6 the same as those in laser diode drive circuit 20 shown in FIG. 5 have the same reference characters allotted and detailed description will not be repeated.

High-side driver circuits IC2-1 and 2-2 are, for example, isolation ICs, and can provide signals from signal sources S1-1 and S1-2 to respective drive circuits IC1-1 and IC1-2 while they isolate signal source S1-1 and drive circuit IC1-1 from each other and isolate signal source S1-2 and drive circuit IC1-2 from each other. By including high-side driver circuits IC2-1 and 2-2 in laser diode drive circuit 21, laser diode drive circuit 21 can be smaller in size than laser diode drive circuit 20 including transformers T1-1 and T1-2. Laser diode drive circuit 21 can otherwise achieve an effect comparable to the effect of laser diode drive circuit 20.

Figure 7:
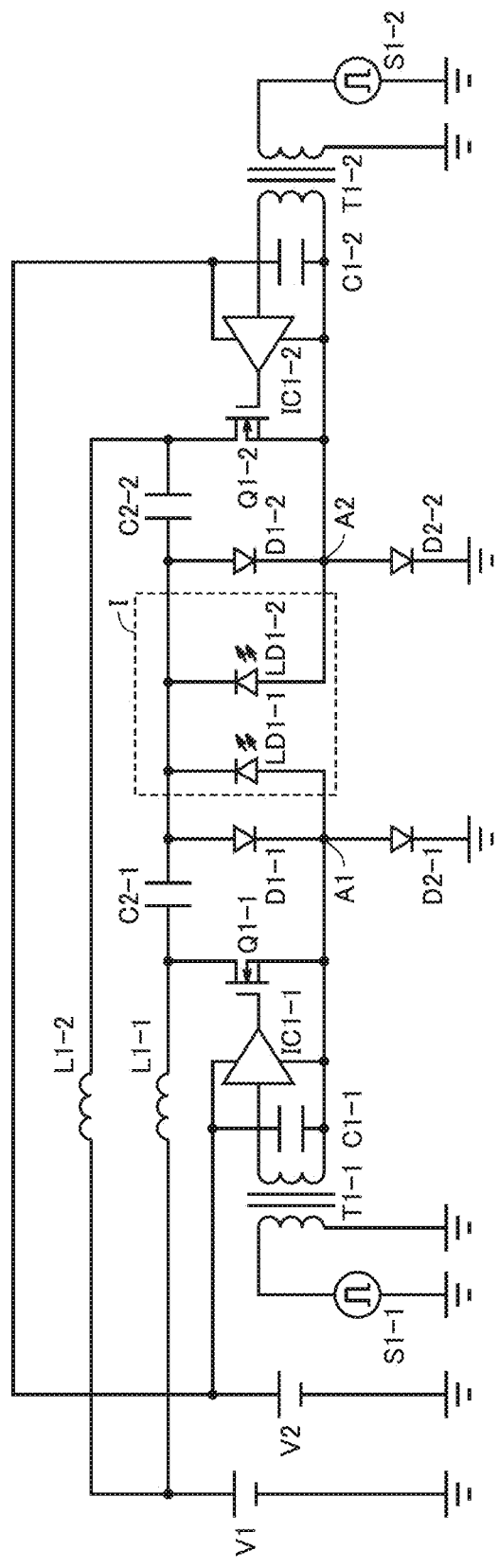
FIG. 7 is a circuit diagram showing a laser diode drive circuit according to a second modification of the second exemplary embodiment.

FIG. 7 is a circuit diagram showing a laser diode drive circuit 22 according to a second modification of the second exemplary embodiment. In laser diode drive circuit 22 shown in FIG. 7, capacitors C2-1 and C2-2 are provided instead of common capacitor C2 shown in FIG. 5. Components in laser diode drive circuit 22 shown in FIG. 7 the same as those in laser diode drive circuit 20 shown in FIG. 5 have the same reference characters allotted and detailed description will not be repeated.

In laser diode drive circuit 20 shown in FIG. 5, a capacitor that supplies a current to laser diodes LD1-1 and LD1-2 is capacitor C2 in common for both laser diodes LD1-1 and LD1-2. In laser diode drive circuit 22 shown in FIG. 7, the capacitor is provided as being split into a plurality of capacitors including capacitor C2-1 that supplies a current to laser diode LD1-1 and capacitor C2-2 that supplies a current to laser diode LD1-2. In laser diode drive circuit 22, inductor L1-1 and diode D1-1 are connected to capacitor C2-1, and inductor L1-2 and diode D1-2 are connected to capacitor C2-2.

Thus, laser diode drive circuit 22 includes a driving capacitor that supplies a current for each laser diode. Therefore, a capacitor in common that is high in capacity does not have to be provided in laser diode drive circuit 22. By providing a plurality of capacitors low in capacity, a size can be reduced and manufacturing cost can be reduced. Since capacitors C2-1 and C2-2 can individually be charged and can individually discharge in laser diode drive circuit 22, capacitor C2-2 for driving laser diode LD1-2 can be charged also while laser diode LD1-1 is driven. Therefore, in laser diode drive circuit 22, emission frequency fsw of pulses of light emitted from laser diodes LD1-1 and LD1-2 can be high. Furthermore, in laser diode drive circuit 22, possibility of light emission from a laser diode other than a laser diode to be driven due to a parasitic capacitance, a parasitic inductance, or a parasitic resistance of the switching element, the laser diode, or a line between components can be lowered.

Laser diode drive circuit 22 can otherwise achieve an effect comparable to the effect of laser diode drive circuit 20.

Third Exemplary Embodiment

A laser diode drive circuit in a third exemplary embodiment will be described. In the first embodiment, inductors are provided to suppress a flow of a current to laser diodes in discharging from a driving capacitor. In contrast, in the third embodiment, the flow of the current in discharging from the driving capacitor is controlled by a switching element. Components similar to those in the first embodiment have the same reference characters allotted and description thereof will not be repeated.

Figure 8:
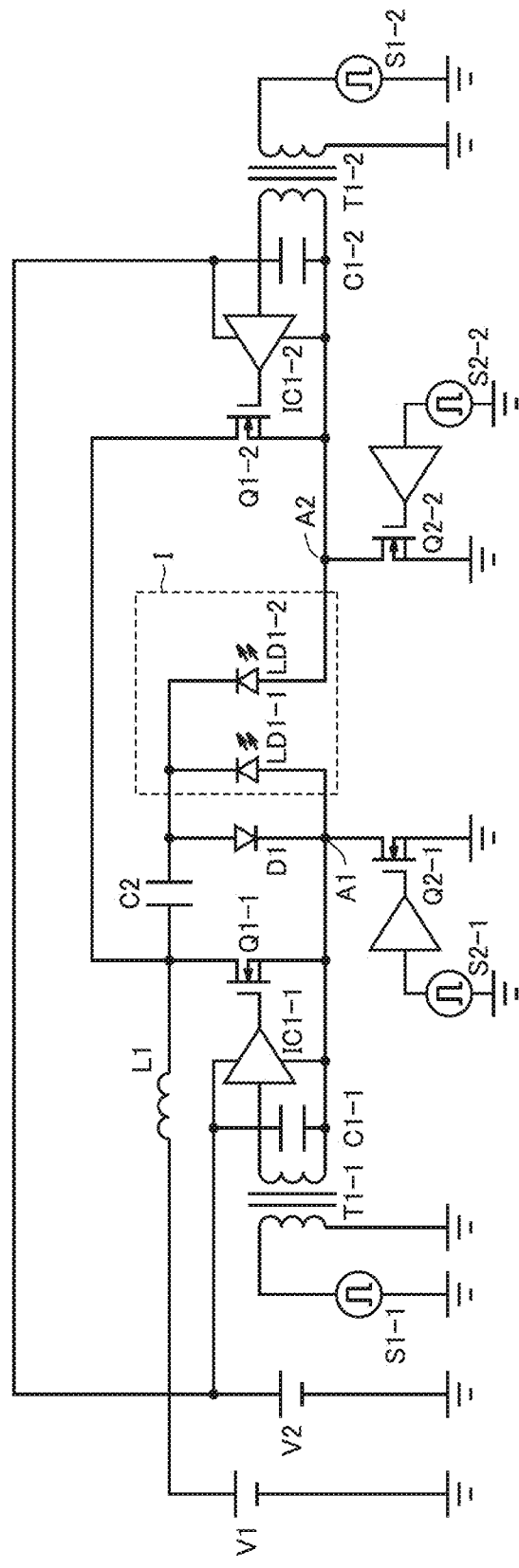
FIG. 8 is a circuit diagram showing a laser diode drive circuit according to a third exemplary embodiment.
Figure 9:
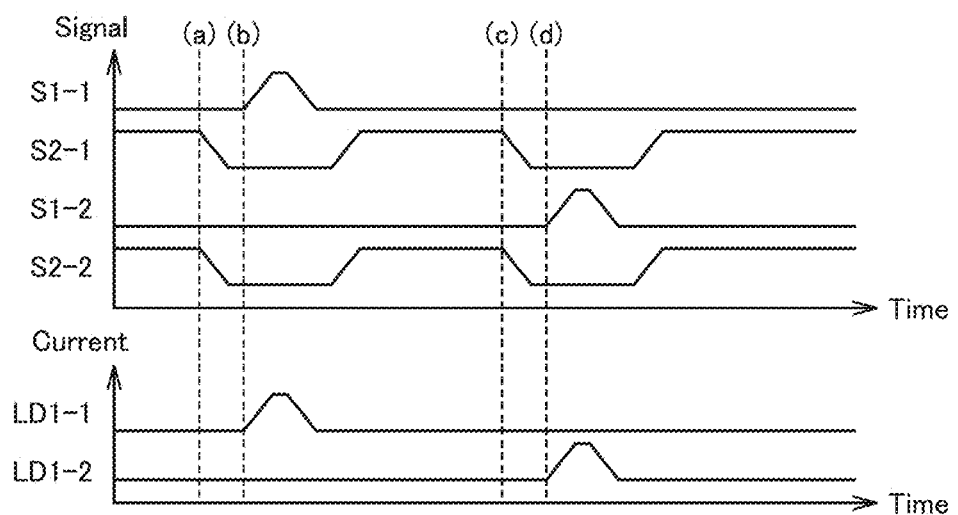
FIG. 9 is a timing chart showing timing of switching of a switching element and a laser diode driving switching element.

FIG. 8 is a circuit diagram showing a laser diode drive circuit 30 according to the third exemplary embodiment. FIG. 9 is a timing chart showing timing of switching of switching elements Q2-1 and Q2-2 and laser diode driving switching elements Q1-1 and Q1-2.

Referring to FIG. 8, switching elements Q2-1 and Q2-2 instead of inductors L2-1 and L2-2 shown in the first embodiment are connected to laser diode drive circuit 30.

Switching elements Q2-1 and Q2-2 are exemplary current suppression elements. Switching elements Q2-1 and Q2-2 switch between the ON state in which a current flows between points of connection A1 and A2 and GND and the OFF state in which the current does not flow. Switching elements Q2-1 and Q2-2 are controlled to the ON state during charging of capacitor C2 and controlled to the OFF state when charging of capacitor C2 is completed.

Referring to FIGS. 8 and 9, switching elements Q2-1 and Q2-2 are controlled to the ON state at any timing during a period for which laser diode driving switching elements Q1-1 and Q1-2 are in the OFF state. FIG. 9 shows signals from signal sources S2-1 and S2-2 provided to switching elements Q2-1 and Q2-2 and signals from signal sources S1-1 and S1-2 provided to laser diode driving switching elements Q1-1 and Q1-2.

When switching elements Q2-1 and Q2-2 are controlled to the ON state, the current flows from driving power supply V1 through inductor L1, capacitor C2, diode D1, and switching element Q2-1 to the ground so that capacitor C2 is charged. At this time, the current does not flow to laser diodes LD1-1 and LD1-2. As charging of capacitor C2 is completed, switching elements Q2-1 and Q2-2 are controlled to the OFF state. Thereafter, laser diode driving switching elements Q1-1 and Q1-2 are controlled to the ON state for a required time period, so that the current flows to laser diodes LD1-1 and LD1-2.

Timing (a) and timing (c) shown in FIG. 9 indicate timing of completion of charging of capacitor C2 (i.e., the timing of switching of switching elements Q2-1 and Q2-2 from the ON state to the OFF state), and timing (b) and timing (d) shown in FIG. 9 indicate timing of switching of laser diode driving switching elements Q1-1 and Q1-2 from the OFF state to the ON state. Timing of switching of switching elements Q2-1 and Q2-2 from the ON state to the OFF state and timing of switching of laser diode driving switching elements Q1-1 and Q1-2 from the OFF state to the ON state are controlled not to coincide with each other. Switching elements Q2-1 and Q2-2 and laser diode driving switching elements Q1-1 and Q1-2 are controlled such that a period of the ON state does not coincide between them. A period for which switching elements Q2-1 and Q2-2 are controlled to the ON state should only be sufficient for charging of capacitor C2. A period for which laser diode driving switching elements Q1-1 and Q1-2 are controlled to the ON state should only be sufficient for having laser diodes LD1-1 and LD1-2 emit light.

Thus, in charging of capacitor C2 (i.e., when the switching elements Q2-1 and Q2-2 are in the ON state and laser diode driving switching elements Q1-1 and Q1-2 are in the OFF state), the current flows to switching elements Q2-1 and Q2-2 and substantially no voltage is applied across the anode and the cathode of each of laser diodes LD1-1 and LD1-2. Therefore, laser diodes LD1-1 and LD1-2 do not emit light. As such, light emission from laser diodes LD1 and LD2 at an undesired timing can be suppressed.

In charging of capacitor C2 (i.e., when switching elements Q2-1 and Q2-2 are in the ON state and laser diode driving switching elements Q1-1 and Q1-2 are in the OFF state), the current flows to switching elements Q2-1 and Q2-2 and substantially no current flows between the anode and the cathode of each of laser diodes LD1-1 and LD1-2.

When laser diodes LD1-1 and LD1-2 are driven (i.e., when switching elements Q2-1 and Q2-2 are in the OFF state and laser diode driving switching elements Q1-1 and Q1-2 are in the ON state), the current flows from capacitor C2 through laser diode driving switching elements Q1-1 and Q1-2 to laser diodes LD1-1 and LD1-2, and does not flow to switching elements Q2-1 and Q2-2.

Laser diodes LD1-1 and LD1-2 emit light by switching of laser diode driving switching elements Q1-1 and Q1-2 from the OFF state to the ON state. By switching a laser diode driving switching element corresponding to a laser diode desired to emit light at timing at which light emission therefrom is desired from the OFF state to the ON state, the laser diode desired to emit light at timing at which light emission therefrom is desired can individually emit light.

In general, it is noted that features in the first and second modifications described in the first exemplary embodiment can be combined with laser diode drive circuit 30 according to the third exemplary embodiment as would be appreciated to one skilled in the art.

[Additional Modifications]

For the laser diode drive circuits described above, configurations for light emission from two laser diodes LD1-1 and LD1-2 are described. A configuration for light emission from three or more laser diodes can also similarly be applied. For example, in a laser diode drive circuit that drives n laser diodes LD1-1, LD1-2, LD1-$n$, inductors L2-1, L2-2, L2-$n$ are connected between the anode sides of the laser diodes and GND. An inductance of each inductor and an impedance of each laser diode satisfy relation in an expression 3 below. L($i$) represents an inductance of each inductor L2-($i$) and Zld($i$) represents an impedance of each laser diode LD1-($i$), i being an integer from 1 to n.

$$|Zld(i)| < 2\pi f l d \times L(i) \qquad \text{(Expression 3)}$$

A configuration of the laser diode drive circuit in which a resistive element is directly connected to each of inductors L2-1, L2-2, L2-$n$ can also similarly be applied. In this case, the inductance of each inductor and the impedance of each laser diode satisfy relation in an expression 4 below. R($i$) represents a resistance value of each resistive element R1-($i$), i being an integer from 1 to n.

$$|Zld(i)| < 2\pi f l d \times L(i) + R(i) \qquad \text{(Expression 4)}$$

REFERENCE SIGNS LIST 10, 11, 12, 13, 20, 21, 22, 30 laser diode drive circuit; C1 drive circuit capacitor; C2 laser diode driving capacitor; D1, D2 diode; I laser diode array

The invention claimed is:

1. A laser diode drive circuit comprising:
a plurality of laser diodes each having cathodes connected in common;
a driving capacitor connected in series to the plurality of laser diodes and configured to supply a current to each of the plurality of laser diodes;
a driving switching element connected in series to the driving capacitor and configured to switch between an ON state in which a current is supplied to the plurality of laser diodes and an OFF state in which the current is not supplied;
a driving power supply configured to supply a current to the driving capacitor; a restriction element connected in parallel to the plurality of laser diodes and in series to the driving power supply and the driving capacitor, with the restriction element configured to restrict a flow of the current in a direction of charging of the driving capacitor; and
a plurality of current suppression elements disposed on anode sides of the plurality of laser diodes, respectively, with the current suppression elements being configured to suppress a flow of a current that flows, during a discharging of the driving capacitor, between adjacent laser diodes of the plurality of laser diodes that are connected in series to each other.

2. The laser diode drive circuit according to claim 1, wherein the plurality of current suppression elements are each an inductor.

3. The laser diode drive circuit according to claim 2, wherein the plurality of laser diodes have an absolute value of an impedance that is a smaller impedance value than a value of the impedance of the inductor at a pulse frequency of the laser diode.

4. The laser diode drive circuit according to claim 2, wherein the plurality of laser diodes each have a pulse frequency within a range not lower than 100 MHz and not higher than 1 GHz.

5. The laser diode drive circuit according to claim 2, further comprising a plurality of resistive elements connected in series to each inductor, respectively.

6. The laser diode drive circuit according to claim 5, wherein the plurality of laser diodes have an absolute value of an impedance that is a smaller impedance value than a sum of an impedance value of the inductor at a pulse frequency of the laser diode and an impedance value of the resistive element.

7. The laser diode drive circuit according to claim 5, wherein the plurality of laser diodes each have a pulse frequency within a range not lower than 100 MHz and not higher than 1 GHz.

8. The laser diode drive circuit according to claim 1, wherein the plurality of current suppression elements are each diodes having anode sides connected in series to the plurality of laser diodes, respectively.

9. The laser diode drive circuit according to claim 1, wherein the plurality of current suppression elements are each a switching element.

10. The laser diode drive circuit according to claim 1, wherein the driving capacitor is a common capacitor that is configured to supply the current to the plurality of laser diodes.

11. The laser diode drive circuit according to claim 1, wherein the driving capacitor is a plurality of individual capacitors that are configured to supply currents to the plurality of laser diodes, respectively.

12. The laser diode drive circuit according to claim 1, wherein the restriction element is a diode.

13. The laser diode drive circuit according to claim 1, wherein the restriction element is a resistive element having a resistance that restricts the flow of the current in the direction of charging of the driving capacitor against impedances of the plurality of laser diodes.

14. The laser diode drive circuit according to claim 1, wherein the driving switching element comprises a plurality of drive circuits each having switching elements that are configured to switch between the ON state in which the current is supplied to the plurality of laser diodes, respectively, and the OFF state in which the current is not supplied.

15. The laser diode drive circuit according to claim 1, further comprising:
- a plurality of signal sources configured to drive the plurality of drive circuits, respectively; and
- a plurality of transformers configured to boost drive signals supplied by the plurality of signal sources to the plurality of drive circuits, respectively.

16. A laser diode drive circuit comprising:
- a plurality of laser diodes each having respective cathodes connected to one another;
- a driving capacitor connected in series to the plurality of laser diodes and configured to supply a current thereto;
- a plurality of driving switching elements configured to drive the plurality of laser diodes, respectively, between an ON state and an OFF state;
- a driving power supply configured to supply a current to the driving capacitor;
- a restriction element connected in parallel to the plurality of laser diodes for restricting a flow of current in a direction of charging of the driving capacitor; and
- a plurality of current suppression elements disposed on anode sides of the plurality of laser diodes, respectively, to suppress a flow of a current that flows, during a discharging of the driving capacitor, from a first laser diode of the plurality of laser diodes to a second laser diode of the plurality of laser diodes that is connected in series to the first laser diode.

17. The laser diode drive circuit according to claim 16, wherein the plurality of current suppression elements are a plurality of inductors.

18. The laser diode drive circuit according to claim 17, wherein the plurality of laser diodes have an absolute value of an impedance that is a smaller impedance value than a value of impedance of the plurality of inductor at a pulse frequency of the laser diodes.

19. The laser diode drive circuit according to claim 17, wherein the plurality of laser diodes each have a pulse frequency within a range not lower than 100 MHz and not higher than 1 GHz.

20. The laser diode drive circuit according to claim 17, further comprising a plurality of resistive elements connected in series to each of the plurality of inductors, respectively.

* * * * *